(12) United States Patent
Nguyen et al.

(10) Patent No.: US 11,903,302 B2
(45) Date of Patent: Feb. 13, 2024

(54) ORGANIC VAPOR JET PRINTING SYSTEM

(71) Applicant: Universal Display Corporation, Ewing, NJ (US)

(72) Inventors: Kent Khuong Nguyen, San Jose, CA (US); Sriram Krishnaswami, Saratoga, CA (US); Daniel Toet, Monte Sereno, CA (US); Jeff Hawthorne, Palo Alto, CA (US); William E. Quinn, Whitehouse Station, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 17/549,066

(22) Filed: Dec. 13, 2021

(65) Prior Publication Data

US 2022/0190245 A1    Jun. 16, 2022

Related U.S. Application Data

(60) Provisional application No. 63/126,475, filed on Dec. 16, 2020.

(51) Int. Cl.
| | |
|---|---|
| *H10K 71/16* | (2023.01) |
| *H10K 71/13* | (2023.01) |
| *C23C 14/50* | (2006.01) |
| *C23C 14/04* | (2006.01) |
| *C23C 14/22* | (2006.01) |
| *H10K 71/10* | (2023.01) |

(52) U.S. Cl.
CPC ............ *H10K 71/135* (2023.02); *C23C 14/04* (2013.01); *C23C 14/228* (2013.01); *C23C 14/50* (2013.01); *H10K 71/164* (2023.02); *H10K 71/191* (2023.02)

(58) Field of Classification Search
CPC ............ H01L 51/0005; H01L 21/6838; H01L 21/67784; C23C 14/228; H10K 71/135
See application file for complete search history.

(56) References Cited

U.S. PATENT DOCUMENTS

| | | | |
|---|---|---|---|
| 4,769,292 | A | 9/1988 | Tang |
| 5,247,190 | A | 9/1993 | Friend |
| 5,703,436 | A | 12/1997 | Forrest |
| 5,707,745 | A | 1/1998 | Forrest |
| 5,834,893 | A | 11/1998 | Bulovic |

(Continued)

FOREIGN PATENT DOCUMENTS

| | | |
|---|---|---|
| EP | 3498882 A1 | 6/2019 |
| JP | 4311992 B2 | 8/2009 |

(Continued)

OTHER PUBLICATIONS

Baldo et al. "Highly efficient phosphorescent emission from organic electroluminescent devices", Nature, vol. 395, pp. 151-154, 1998.

(Continued)

*Primary Examiner* — Aiden Lee
(74) *Attorney, Agent, or Firm* — Butzel Long

(57) ABSTRACT

Systems and methods for depositing materials on a substrate via OVJP are provided. A float table and grippers are used to move and position the substrate relative to one or more OVJP print bars to reduce the chance of damaging or compromising the substrate or prior depositions.

33 Claims, 13 Drawing Sheets

(56) References Cited

U.S. PATENT DOCUMENTS

| | | |
|---|---|---|
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 10,704,144 B2 | 7/2020 | McGraw |
| 10,818,840 B2 | 10/2020 | Quinn |
| 2003/0230980 A1 | 12/2003 | Forrest |
| 2004/0174116 A1 | 9/2004 | Lu |
| 2013/0273746 A1* | 10/2013 | Kawato ............... H01L 51/0008 438/758 |
| 2015/0111323 A1* | 4/2015 | Imanaka ............... C23C 14/243 118/724 |
| 2015/0171368 A1* | 6/2015 | Vronsky ................ B41J 2/2054 438/7 |
| 2015/0376787 A1 | 12/2015 | McGraw |
| 2015/0380648 A1 | 12/2015 | McGraw |
| 2016/0144392 A1* | 5/2016 | Ryu ..................... C23C 14/042 118/713 |
| 2017/0229663 A1 | 8/2017 | Tsai |
| 2017/0291187 A1 | 10/2017 | Van Putten |
| 2018/0067397 A1* | 3/2018 | Aoki .................... G03F 7/70775 |
| 2018/0229497 A1 | 8/2018 | Darrow |
| 2018/0296494 A1* | 10/2018 | Shalev ................... A61K 45/06 |
| 2018/0323372 A1* | 11/2018 | Quinn ..................... C23C 14/12 |
| 2019/0218655 A1 | 7/2019 | McGraw |
| 2019/0221783 A1 | 7/2019 | McGraw |
| 2019/0305224 A1* | 10/2019 | Hack .................... H10K 50/844 |

FOREIGN PATENT DOCUMENTS

| | | |
|---|---|---|
| KR | 101931814 B1 | 12/2018 |
| TW | 201145432 A | 12/2011 |
| WO | 2008057394 A1 | 5/2008 |
| WO | 2010011390 A2 | 1/2010 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Extended European Search Report issued in App. No. EP21215050. 2, dated May 10, 2022, 15 pages.

Quinn, William et al., "Organic Vapor Jet Printing, a Solvent-Less, Mask-Less Patterning Technology for OLED Displays," Invited Paper 10-3, SID 2017 Digest, vol. 48, No. 1, May 1, 2017, pp. 119-122, XP055915853, 4 pages.

* cited by examiner

Heat Shield Bottom Chamber Installed with Exhaust Port

Die Manifold Mounted into Heat Shield Top Chamber

Heat Shield Top and Bottom Chamber

Die Manifold + Heating Element

ORGANIC VAPOR JET PRINTING SYSTEM

CROSS-REFERENCE TO RELATED APPLICATIONS

This application claims the priority benefit of U.S. Patent Application Ser. No. 63/126,475, filed Dec. 16, 2020, the entire contents of which are incorporated herein by reference.

FIELD

The present invention relates to devices and techniques for fabricating organic emissive devices, such as organic light emitting diodes, and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-S00 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
| --- | --- |
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321] |
| Central Blue | Locus: [0.1746, 0.0052]; [0.0326, 0.3530]; |

-continued

| Color | CIE Shape Parameters |
| --- | --- |
| Central Yellow | Interior: [0.2268, 0.3321] Locus: [0.3731, 0.6245]; [0.6270, 0.3725]; Interior: [0.3700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

Embodiments disclosed herein provide deposition systems that include one or more print bars, which may be OVJP-type print bars, each of which includes one or more print heads; a float table comprising one or more substrate grippers configured to hold a substrate and to adjust a position of the substrate on the float table in at least two degrees of motion; and one or more controls arranged to provide control over the one or more substrate grippers. The system may include one or more sensors to measure an alignment of a substrate on the float table with the one or more OVJP print bars. The float table may extend through the system such that it extends before and after the print bars, or the float table may be movable in a region that extends below the one or more OVJP print bars. The substrate may be movable on the float table independently of movement of the float table below the one or more OVJP print bars, for example to allow for fine-grained positioning of the substrate on the float table.

Embodiments also provide methods of operating a deposition system by obtaining a substrate; placing the substrate on a float table and securing and adjusting the position of the substrate using one or more grippers. The float table and/or the substrate may be moved through the system, or the substrate may be moved across the float table to move it through an area below a print bar, such as an OVJP print bar in the deposition system. While the substrate is being moved through the system, material may be ejected from the print bar to be deposited on the substrate. After deposition, the float table and/or the substrate may be moved to a position at which the substrate is not below the print bar.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
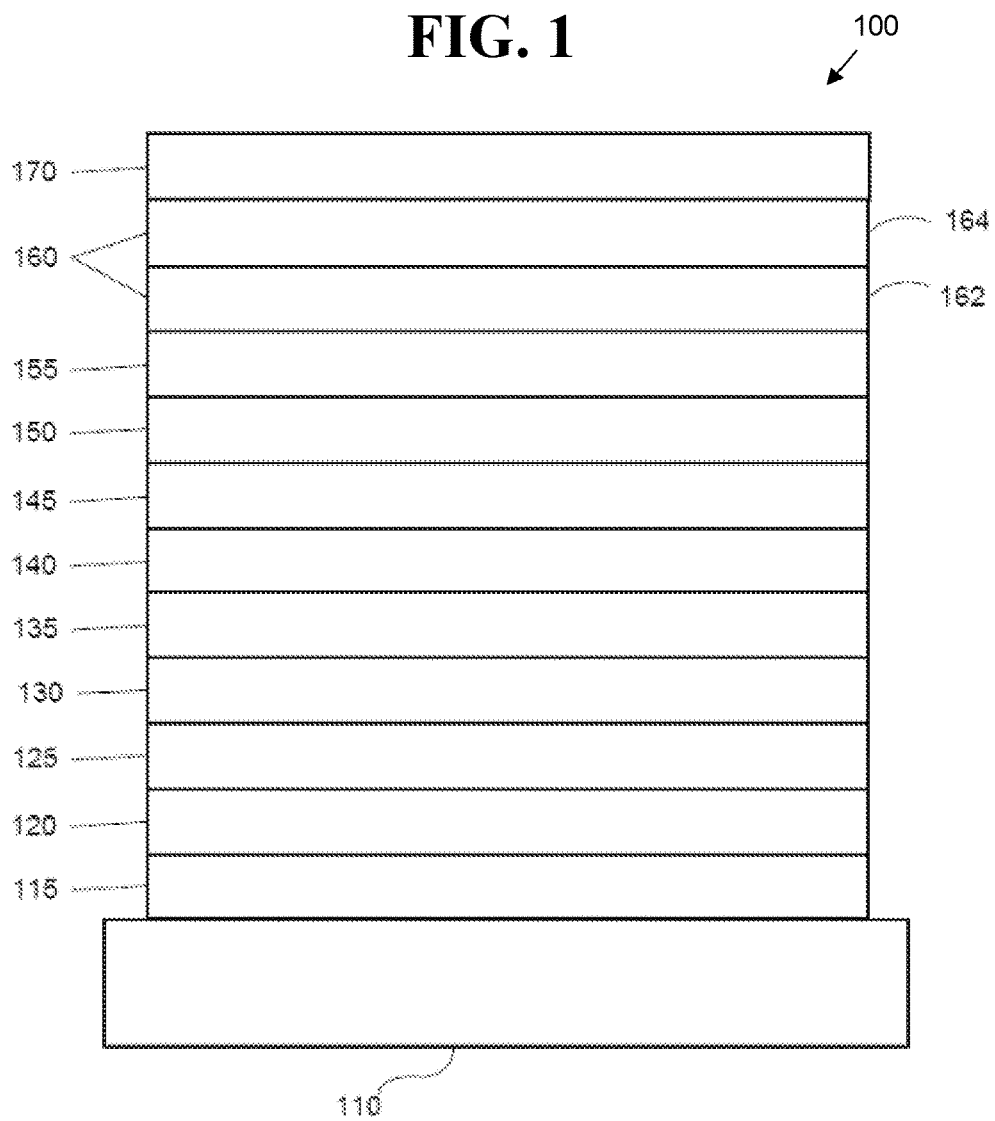
FIG. 1 shows an organic light emitting device structure that may be fabricated using the devices and techniques disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
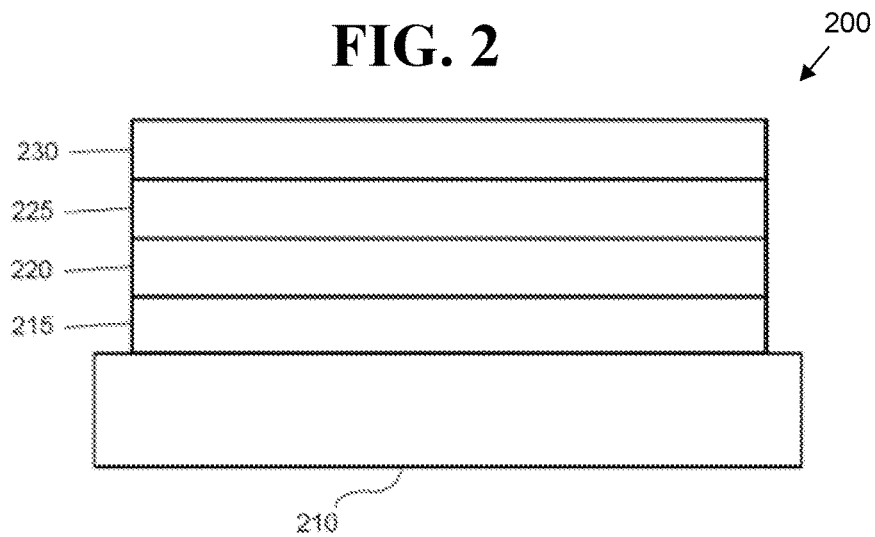
FIG. 2 shows an example structure of an inverted organic light emitting device that does not have a separate electron transport layer, as may be fabricated using the devices and techniques disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small ΔES-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, conventional OVJP processes typically involve the dispensation of organic materials, such as active organic AMOLED materials, in heated gaseous mixtures through print nozzles. Conventional OVJP processes typically use a range of pressure between 10 Torr and 1 Atm (760 Torr). Print nozzles may be manufactured using micro-electromechanical (MEMS), micro-machining, 3D printing, or similar processes. Example structures of OVJP depositor devices are provided herein, but generally a "print bar" as disclosed herein may include one or more "print heads," each of which includes at least one print die. The print head typically includes the interfaces to each print die in the print head, including mechanical mounts, gas delivery, exhaust interfaces, heating components, and the like. The use of multiple print heads on a print bar may enable, for example, concurrent printing of multiple pixels on a substrate. The print bars may themselves be heated in order to facilitate the deposition process.

Embodiments disclosed herein provide various systems and techniques that allow for efficient transport of substrates past one or more print bars in a deposition chamber, while allowing for precise and efficient control over the proximity between substrates and print bars. This in turn may allow for precise control over the thickness and uniformity of layers printed with the system, which may vary by application. For example, different sizes and types of display panels may require different thicknesses, tolerances, and the like. Print bars and the substrate also may be movable relative to one another, for example, to allow the print bars to be arranged perpendicular or parallel to the substrate, or at any other desired angle relative to the substrate or the system, for example relative to the primary y-axis. The substrate also may be rotated or translated in other directions during processing, i.e., as it is moving through the system in the primary y direction. For example, when printing sub-pixels or similar features, material may be printed along the y-axis and, after a sub-pixel or set of sub-pixels is printed, the substrate may be moved in another direction, such as by shifting one sub-pixel position along the x-direction. Such a process may be used, for example, to print multi-component or multi-color sub-pixels. As shown and described in various example arrangements herein, the print bars typically are arranged perpendicular to the direction of the substrate motion during processing, while the substrate and/or a substrate carrier such as a flat table may be rotated relative to the print bars. Individual or redundant print bars or sets of print bars may be used.

Embodiments disclosed herein provide arrangements in which there is little or no direct physical contact, or in some embodiments only temporary or transitory physical contact, between the substrate on which material is to be printed via OVJP and any other surface. This reduces the chance of undesirable voltage buildup and/or electrostatic discharge (ESD), thereby minimizing or eliminating associated damage to the substrate, prior-deposited layers, and underlying electrical circuits, such as a display backplane or AMOLED layers. In most deposition systems disclosed herein, the substrate does not physically contact any surface. However, in some embodiments, the substrate may be contacted by a solid moving vacuum chuck on the back (non-active) side of the substrate. When such a device is used, it may incorporate ESD minimization techniques such as ionizers and appropriate ESD-safe techniques to vacuum down and remove substrates from the chuck.

Embodiments disclosed herein may be capable of depositing on a range of substrate types and sizes. For example, glass and other materials known for use in OLEDs may be used as substrates on which materials are printed by the systems disclosed herein. Conventional OLED fabrication systems and similar systems may have difficulty manipulating and printing on some substrates, such as very large glass substrates, due to the increased momentum that results from moving the substrate in the system and the possibility of sag in unsupported portions of the substrate. However, physically supporting the substrate at all points generally is undesirable due to the risk of damage or contamination of the substrate. To address these issues, embodiments disclosed herein use various combinations of pressure-vacuum float tables and other components as described in further detail below. These embodiments allow for manipulation of relatively large and sensitive substrates with greatly reduced risk of damage and contamination. Embodiments disclosed herein may efficiently manipulate and deposit materials on substrates having edge measurements of 1-5 m or more. Larger substrates, referred to as "mother glass," also may be used to fabricate multiple devices in a single pass or a small number of passes through the deposition systems disclosed herein, after which the larger substrate is separated into individual devices. For example, current 10th- or 11th-generation mother glass typically has dimensions of about 2940 mm×3370 mm, which size substrate may be successfully manipulated and processed by embodiments disclosed herein. More generally, substrates having maximum edge measurements of 1, 2, 3, 4, or 5 m in any aspect ratio may be manipulated and processed by any embodiments disclosed herein.

Systems as disclosed herein may accept input substrates, i.e., substrates on which material is to be deposited via OVJP, via a pressure-regulated load lock chamber. The substrates may be output to the same input lock or to a separate output load lock after material has been deposited thereon, so as to enable integration into various fabrication systems and techniques. For example, deposition systems disclosed herein may be used in in-line fabrication systems and processes in which substrates flow in one direction throughout the fabrication process.

Embodiments disclosed herein may include multiple print bars, each of which may include one or more print die and/or smaller print bars, each of which may include one or more print die. Each print die may be encapsulated in a "print engine" as disclosed herein. As used herein, a "print engine" is a component or sub-system that provides an integrated and consistent framework for gas input(s), gas exhaust(s), height measurement, and active height control of the associated print die. Generally a print bar as disclosed herein includes one or more print engines.

The use of multiple print bars may allow for flexibility in the system, such as the ability to dispense multiple chemistries within a single process chamber, reduced time between loading and unloading the system relative to conventional systems, improved print uniformity, and the like. The use of multiple and/or smaller print bars also allows for greater flexibility. In some configurations, each smaller print bar may be controllable to move perpendicular to the motion of the substrate through the system, parallel to the substrate motion, and/or in the vertical (z) direction relative to the substrate, i.e., closer to or farther away from the substrate surface on which material is deposited.

Print bars as disclosed herein may span the width of the system such that they extend across the width of a substrate being processed by the system, thereby allowing for deposition on any part of the substrate. Where multiple print bars are used, they may be arranged in-line or in a staggered arrangement.

Embodiments disclosed herein allow for a range and variety of physical motion control of the substrate and/or other components of the system, to allow for precise positioning of the substrate relative to the OVJP print nozzles. For example, the positioning of the substrate may be controlled as it moves past one or more print bars using active positioning adjustments both in the plane of the substrate and vertically toward or away from the print bars. Generally, it is preferred to maintain the surface of the substrate in a plane parallel to, or essentially parallel to, the plane of OVJP nozzles in the print bar, preferably within 1-10 degrees or less, preferably less than 5 degrees, more preferably less than 1 degree. More generally, embodiments disclosed herein include physical controls that allow for precise adjustment of the gap between the print bars and the substrate arbitrarily close to a target separation value, which allows the system to maintain the substrate within the process window of deposition. Similarly, some or all of axes of motion of the system may be synchronized, for example using real-time controllers, to allow for precise and orchestrated adjustments of the print bar and substrate. In some embodiments, the substrate also may be rotated while inside the deposition system to allow for different orientations of components relative to deposited material, such as to support different display and/or backplane orientations on the substrate. The various controllable motions of the system also allow for multiple passes of the substrate past one or more print bars, for example to allow for concurrent printing by multiple print bars, repeated sequential printing from one or more print bars, patterned printing via one or multiple print bars, and the like.

Embodiments may include a subsystem for inspection and/or calibration that can be moved through the deposition system following the direction of motion of the substrate past the print bars. Such a component may allow for in-situ periodic inspection and metrology of the print bar and nozzles. For example, the system may have optical, thermal and other sensors on board, which also may be able to move in a direction parallel to the print bar so that arbitrary locations of any print bar may be inspected. The data collected from the print bar inspection may be used, for example, to make dynamic adjustments to the print bars or to substrate motion, or perform cleaning as needed. The data may also be used to predict possible failures and allow for predictable system maintenance.

Embodiments may include various components and techniques to manage heat generated by the hot gaseous mixture ejected from the OVJP print nozzles and other components.

An OVJP deposition system as disclosed herein may be arranged within a vacuum chamber as with conventional OLED deposition systems, such as other types of OVJP systems. In embodiments disclosed herein, the motion system may be isolated from the vacuum chamber walls, for example via isolation mechanisms that operate from regular atmosphere (external to the chamber) through strategically-placed feedthroughs as disclosed herein.

Figure 3A:
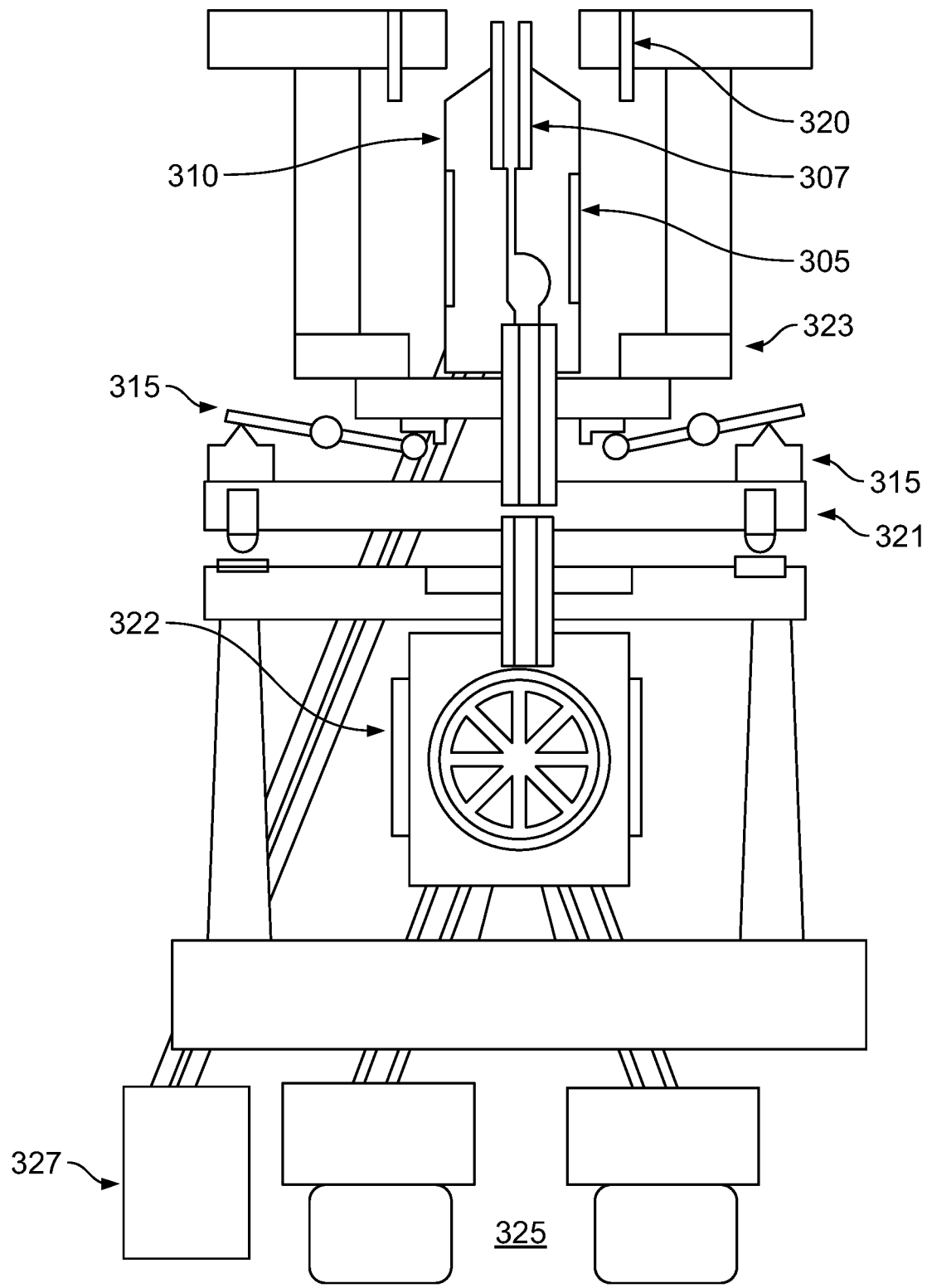
FIG. 3A shows an example of a print engine as disclosed herein.

As previously disclosed, OVJP print die as disclosed herein may be encapsulated in one or more print bars through print engines. A print engine as used herein refers to as a subsystem that includes one or more print die, associated interfaces to input gas flow and exhaust flow, height sensors (if any), and height adjustment mechanisms (if any). FIGS. 3A-3D show examples of print engines as disclosed herein. FIG. 3A shows an individual print engine. The example in FIG. 3A is orientated in an upward direction, i.e., with the nozzle facing "up" (toward the top of the page). It will be understood that the same arrangement and configuration may be used for downward-facing print heads in embodiments in which the substrate is positioned below the print head, i.e., in the direction of gravity relative to the print head. However, as used herein, a substrate may be described as being disposed "below" a print bar and the print bar described as being "above" the substrate when the two are arranged such that material ejected from OVJP nozzles of the print bars is ejected toward the substrate, regardless of the arrangement of the components relative to the direction of gravity.

Figure 3B:
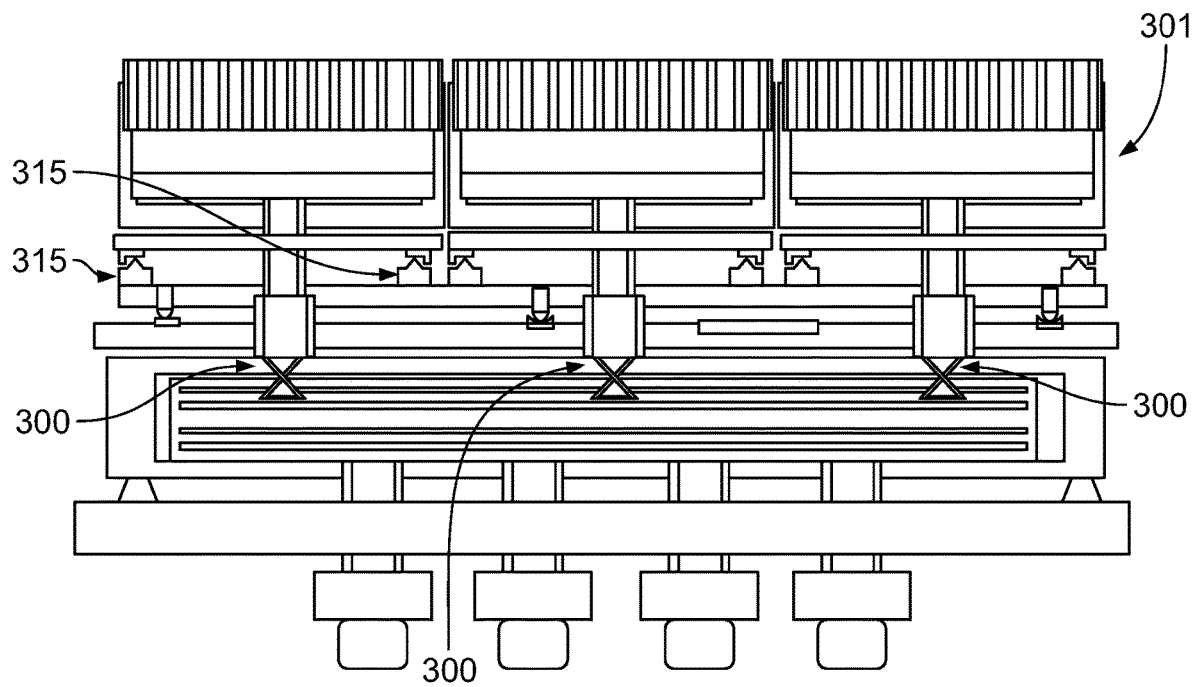
FIG. 3B shows an example of a system using a print bar with multiple print engines operating at the print head level as disclosed herein.
Figure 3C:
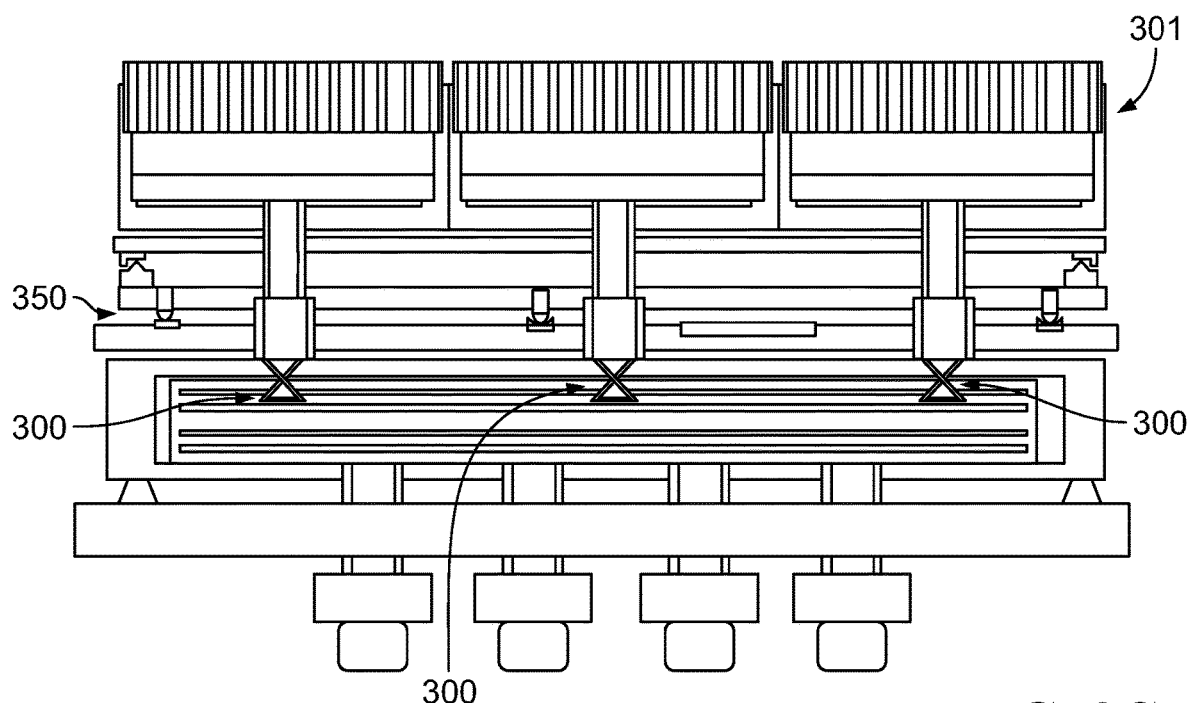
FIG. 3C shows an example of a system using a single print engine operating at the print bar level as disclosed herein.
Figure 3D:
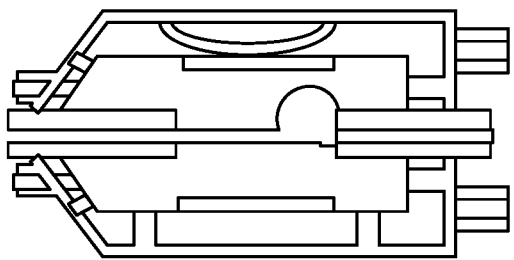
FIG. 3D shows an exploded view of a die manifold, heat shield, and related components as disclosed herein.
Figure 3D:
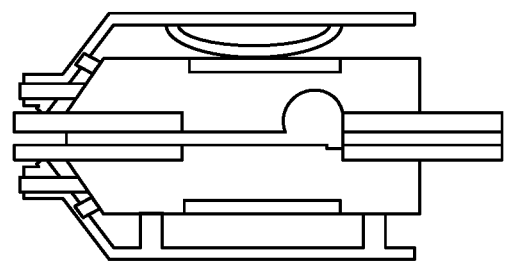
Figure 3D:
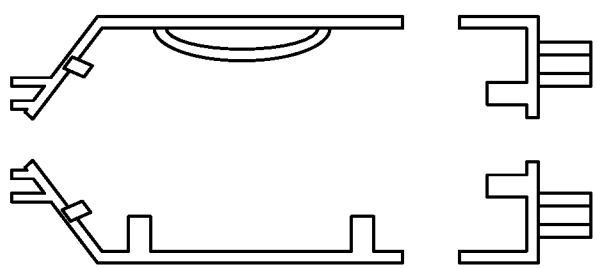
Figure 3D:
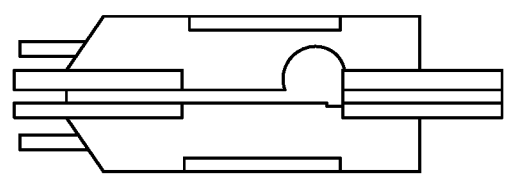

FIG. 3B shows an example of a system using a print bar with multiple print engines operating at the print head level, i.e., each print head includes height sensors and vertical position control. FIG. 3C shows a similar arrangement which has a single print engine operating at the print bar level, i.e., the print bar includes multiple print heads, but has a single vertical position control for the print bar as a whole. In FIG. 3B, each print head includes individual height sensors, whereas in FIG. 3C the print bar includes one or more height sensors and height adjustors that control the height of the bar as a whole. As previously disclosed, a print engine may include a print die 307 as is known in the OVJP art, incorporated into a print head sub-assembly 310, which may include one or more heating elements 305, OVJP delivery nozzle, and other standard OVJP depositor components. An exploded view of a die manifold, heat shield, and other related components is shown in FIG. 3D. Regardless of whether individual or print-bar level height adjustors are used, a print engine may include height control (z direction) mechanisms 315, such as levers attached to actuators, that may be used to adjust the height and/or orientation of the print head. In embodiments in which each print head has individual height sensors and adjustors, height sensors 320 may be arranged on an outer edge of a support structure 323 or otherwise arranged to detect and allow for adjustment of the relative height of the print head relative to a substrate. The entire assembly also may be supported by a lower support structure 321. A mixing chamber 322 may allow for mixture of one or more materials received from a source chamber 325. The print die also may be in fluid communication with an exhaust 327, for example to allow for removal of gas and other material in the region between the print head nozzle and the substrate during operation of the deposition system and to limit lateral spread of material exiting each nozzle, so as to limit or prevent cross-talk between adjacent nozzles. As shown in FIGS. 3B and 3C, a print bar 301 may include multiple print heads 300. Print engines interface to gas input and exhaust is through the use of distribution manifolds. A single manifold may serve multiple print engines or only a single engine. Notably, the use of print engines as shown in FIGS. 3A-3D is independent of the arrangements and configurations described herein with respect to substrate motion. That is, the print bar and print head configuration shown in FIGS. 3A-3D may be used with any of the embodiments disclosed herein with appropriate changes, such as orienting the print bar to print in an upward or downward direction depending on the orientation of the substrate. In some embodiments, the print engine may include design features to manage the heat load from the hot print die such as the heat shield arrangement shown in FIG. 3D, which may be tightly integrated with the print head to fully insulate the surroundings from the hot print head during operation.

Figure 3E:
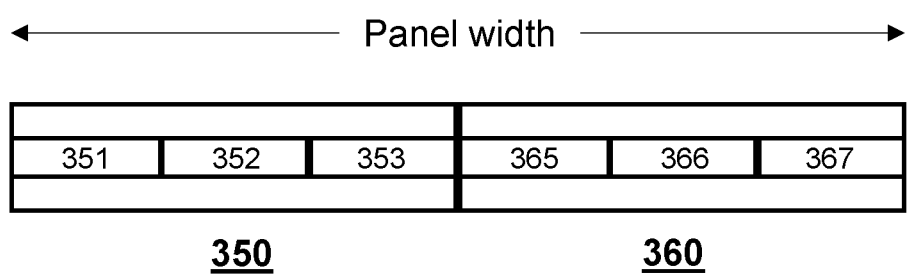
FIGS. 3E and 3F show example arrangements of print bars as disclosed herein.
Figure 3F:
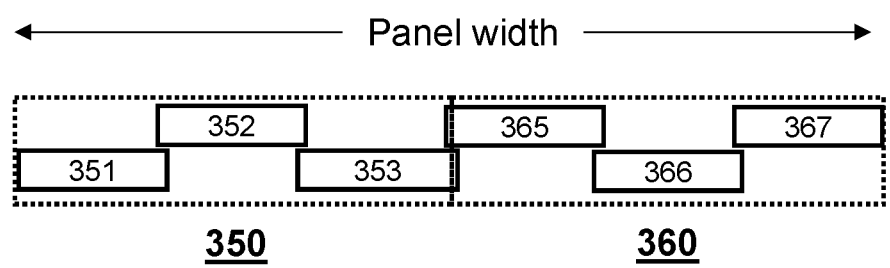

Embodiments disclosed herein may use one or more print bars, each of which may include one or more print heads. As previously disclosed, in embodiments that use multiple print bars, the print bars may be positioned in a linear arrangement, for example as shown in FIG. 3E, or they may be staggered relative to one another as shown in FIG. 3F, each of which shows a view of representative print bars 350, 360, each including three print heads 351, 352, 353 and 365, 366, 367, respectively, as seen from the perspective of a substrate in the OVJP system. For example, print die may have an exclusion area at the end of each die that cannot be used for print apertures, which is used for processing the die and attaching it to the print engine. If such adjacent die were immediately adjacent to one another, there may be apertures missing where the die abut one another; in this case a staggered arrangement may be preferred to account for these areas. Generally, both staggered and linear arrangements may be used to print a selected region, such as a display panel or region, in one or more passes. However, typically a staggered arrangement may be simpler and more efficient to assemble into a print bar than a linear arrangement without end exclusion areas. A staggered arrangement also may allow for a deposition of material over a relatively large area, such as to fabricate a 55" or larger display panel using fewer passes of the panel substrate through the system by using redundant parallel bars that deposit over the same areas of the substrate, thereby allowing for thicker depositions in fewer scans of the substrate under the print heads. Where staggered arrangements as in FIG. 3F are used, print heads on adjacent ends of the print bars may overlap with the print heads on the other bar, such as print heads 353, 365 in FIG. 3F.

Figure 4A:
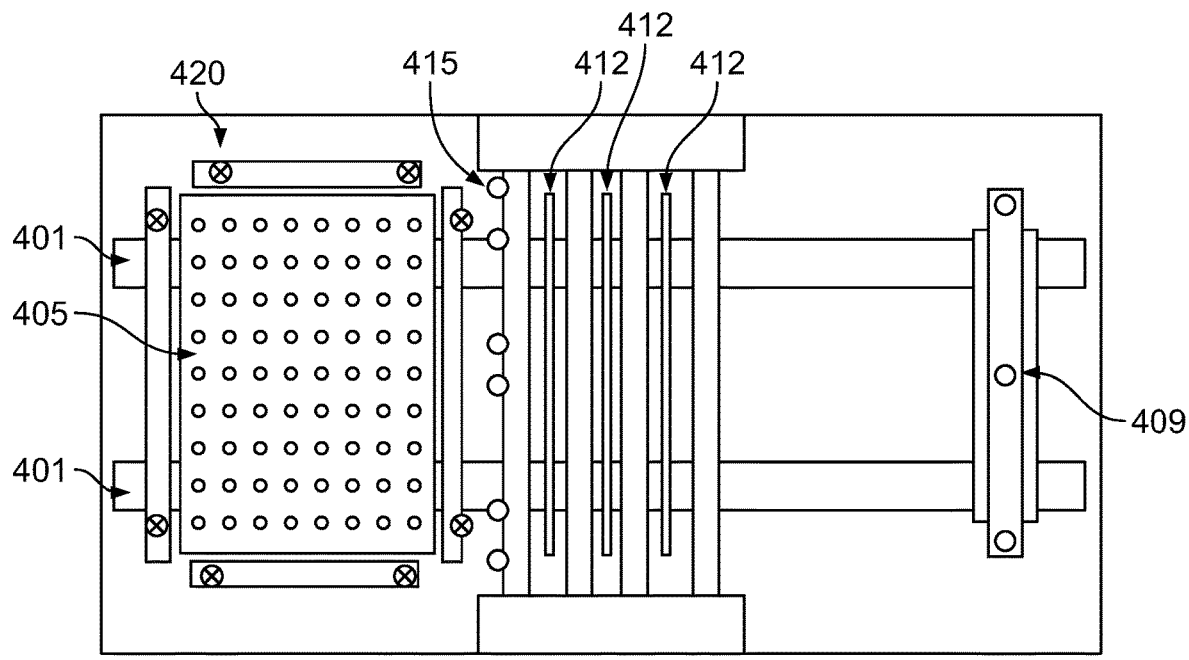
FIGS. 4A and 4B show top-down and side views, respectively, of an example OVJP deposition system according to embodiments disclosed herein.
Figure 4B:
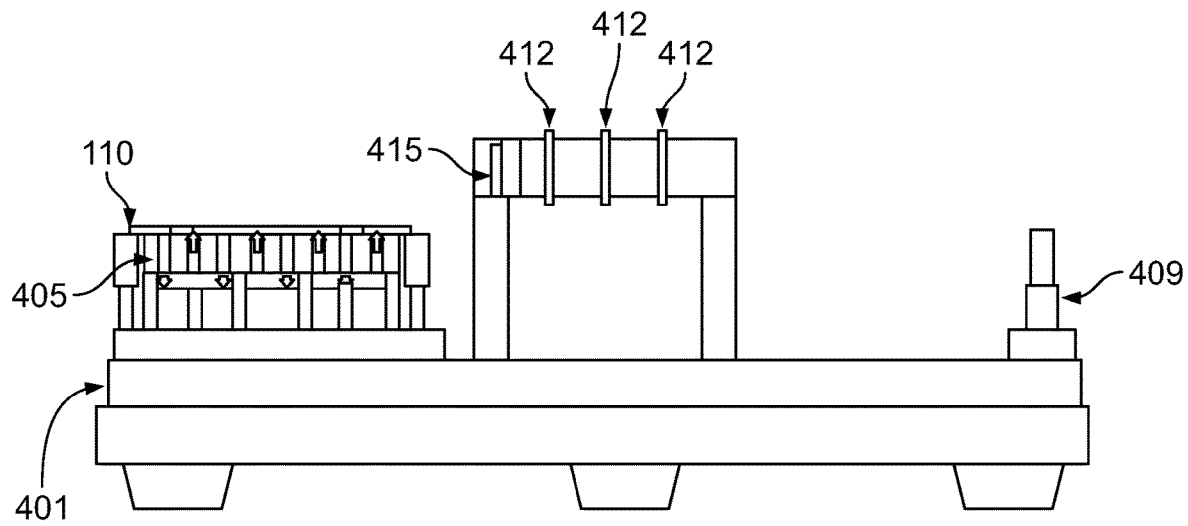

FIGS. 4A and 4B show top-down and side views, respectively, of an example OVJP deposition system according to embodiments disclosed herein. A pressure-vacuum (PV) float table 405, which also may be referred to herein and in the art as a "PV table" or "float table", supports the glass substrate on the non-active backside of the substrate. The float table provides a vacuum/air cushion, for example using Nitrogen or other suitable gases, and may include one or more grippers 420 positioned around on one or more sides, preferably all four sides of the PV table. Because in this and other embodiments the substrate does not physically contact anything other than the substrate grippers which have minimal contact area, the chances of tribological electrostatic charge build up are minimal. The entire PV table 405 may be moved as a single assembly or sub-system with the substrate through the system from the input side (shown on the left side of FIG. 4A) along the primary y-direction of movement 401 and past the print bars 412 to complete printing. As previously disclosed, each print bar may include one or more print heads. For example, the system may include three print bars, each configured to print a primary color to produce a full-color display on the substrate, though embodiments disclosed herein are not limited to any particular number of print bars or any specific arrangement of colors, chemistries, or other arrangement of layers and/or materials. In this example, the active side of the substrate faces upward and the print bars are disposed above the substrate, printing downward on the active side of the substrate. That is, the print bars are configured and arranged such that material ejected from the print heads travels in the downward direction of gravity until it impinges on the substrate surface facing the print bars.

Figure 4C:
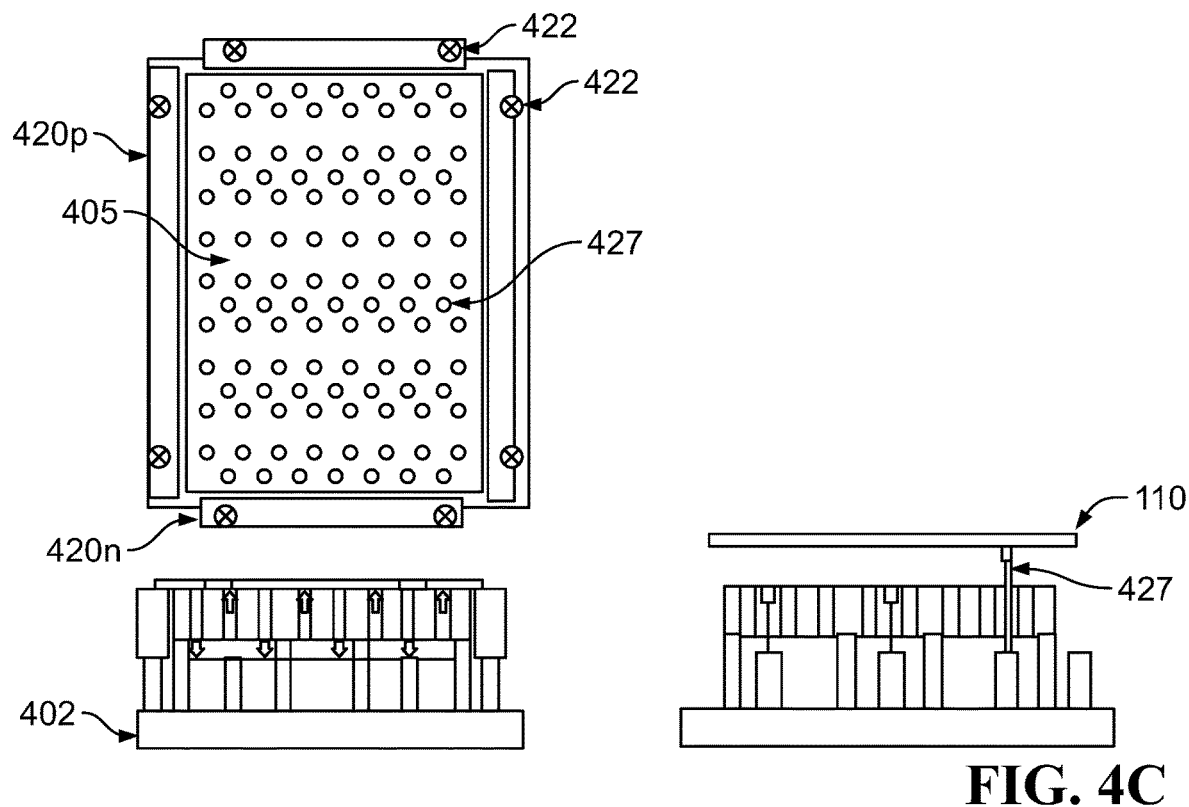
FIG. 4C shows top, side, and front views of a substrate PV table according to embodiments disclosed herein.

FIG. 4C shows top, side, and front views of the substrate PV table 405, which may itself be held on a PV table support base 402. The PV table 405 may include features to maintain the system in a level and stable arrangement, such as mounting features allowing for precise leveling, latches or other connectors to secure the table to the support base 402, and the like. The table 405 may include multiple vacuum gripper pairs or subsystems 420$p$, 420$n$, such as for use in portrait or landscape substrate arrangements, respectively, which hold the substrate. Specifically, the substrate grippers 420 may allow for adjustment of a substrate position in at least two, and preferably three, degrees of motion. For example, the substrate grippers may allow for movement of the substrate in the x, z, and/or θ directions. As used here, the "x" direction refers to an axis in the plane of the substrate and perpendicular to the direction of movement of the substrate through the deposition system 401; the "z" direction refers to the vertical direction, perpendicular to the plane of the substrate, toward/away from the print bars; and "θ" refers to angular/rotational adjustment of the substrate around the z-axis, i.e., rotation in the plane of the substrate. Such motions may be achieved in any embodiment disclosed herein which uses such grippers and/or which allows for movement of the substrate and/or any substrate supporting structure, such as the substrate float table 405 shown. This adjustability allows for alignment of the backplane on the substrate with the print bars and provides a mechanism to maintain precise alignment even as the substrate travels through the system.

The deposition system also may include one or more controls that provide for user and/or automated control over the substrate grippers. For example, the controls may include human interface components and/or electronic interfaces that allow for adjustment of each degree of motion available to the grippers. The grippers 420 may include minimal-physical contact devices to hold and position the substrate, such as vacuum grippers or other pressure-based grippers that hold only one or more edges and/or only the back side of the substrate. Accordingly, the gripper controls may include pressure-volume (PV) controls. Substrate grippers as disclosed herein also may be used to maintain the substrate in a planar arrangement, for example, by counteracting the force of gravity on the substrate, which otherwise may cause the substrate to sag. As a specific example, one or more substrate grippers may hold the edges and/or back non-active side of the substrate to maintain the substrate in a planar configuration while it is processed by the system. This feature may be especially desirable in embodiments in which the print bars print in an upward direction, i.e., opposite the force of gravity.

The substrate PV table 405 may include one or more lift pins 427 which may be used to position the substrate 110 initially on the PV table before retracting to allow the substrate 110 to be suspended and held in position by the gas cushion provided by the PV table. Lift pins or equivalent components may be used, for example, to position the substrate using minimal surface area contact with the substrate. Alternatively, the lift pins may include channels to allow pressurized gas to pass through the pins, thereby floating the substrate on the lift pins. In some embodiments disclosed herein that use a PV float table or equivalent structure, the substrate is movable on the PV table independently of movement of the PV table itself through the deposition system. That is, the float table may be movable through the system, such as from an input lock to an output lock along a path that moves the PV table and the substrate below the print bars. Concurrently, the position of the substrate on the PV table may be adjusted as disclosed herein, regardless of the position and/or movement of the PV table. Such an arrangement may allow for relatively large movements of the substrate to be made using the PV table, while fine adjustments of the substrate relative to, for example, the print bars, may be made (for example using the substrate grippers as previously disclosed) on the PV table and independently of the motion of the PV table. Alternatively, the substrate may be held in a fixed position relative to the PV table by the grippers as it moves on the PV table through the deposition system. In some embodiments, movement and positioning of the substrate grippers may be controlled at least partially by the PV float table or synchronized with movement of the table. For example, the substrate grippers may be operable under a weightless state while following the substrate floating in the z-direction on the PV table, such as via gripper controls as disclosed herein.

The float table may include a gas confinement system to prevent leakage of gas ejected by the OVJP print bars from reaching the edges of the substrate. For example, gas curtains and/or exhaust channels may be disposed around the edge of the substrate via channels in the float table to exhaust overflow gas away from the substrate and the float table.

Figure 4D:
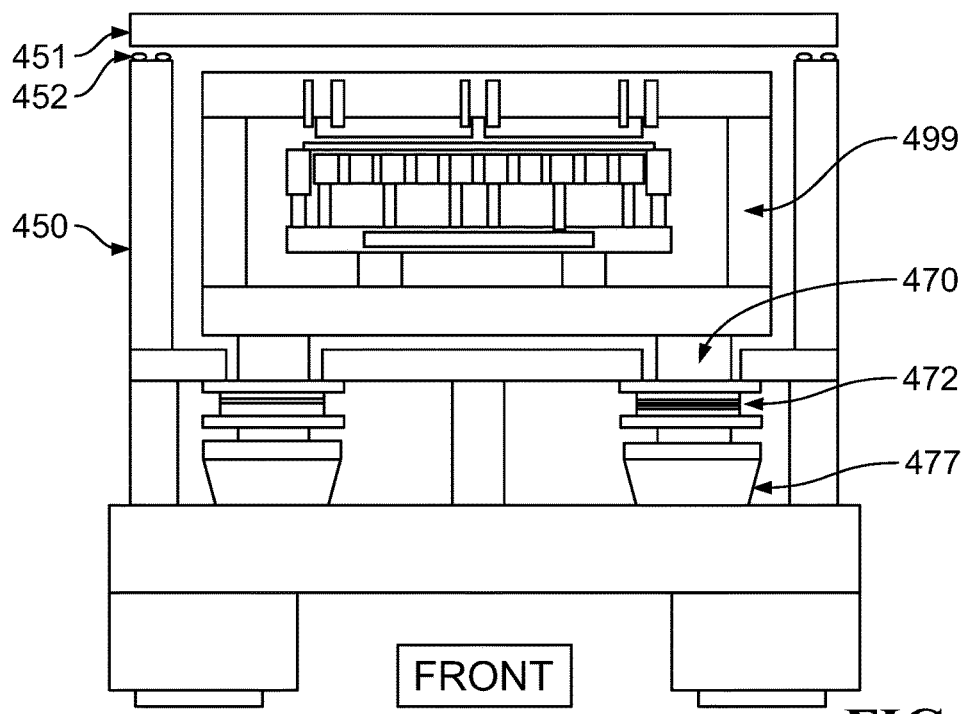
FIG. 4D shows a front view of an OVJP system as shown in FIGS. 4A-4C positioned in a vacuum chamber according to embodiments disclosed herein.
Figure 4E:
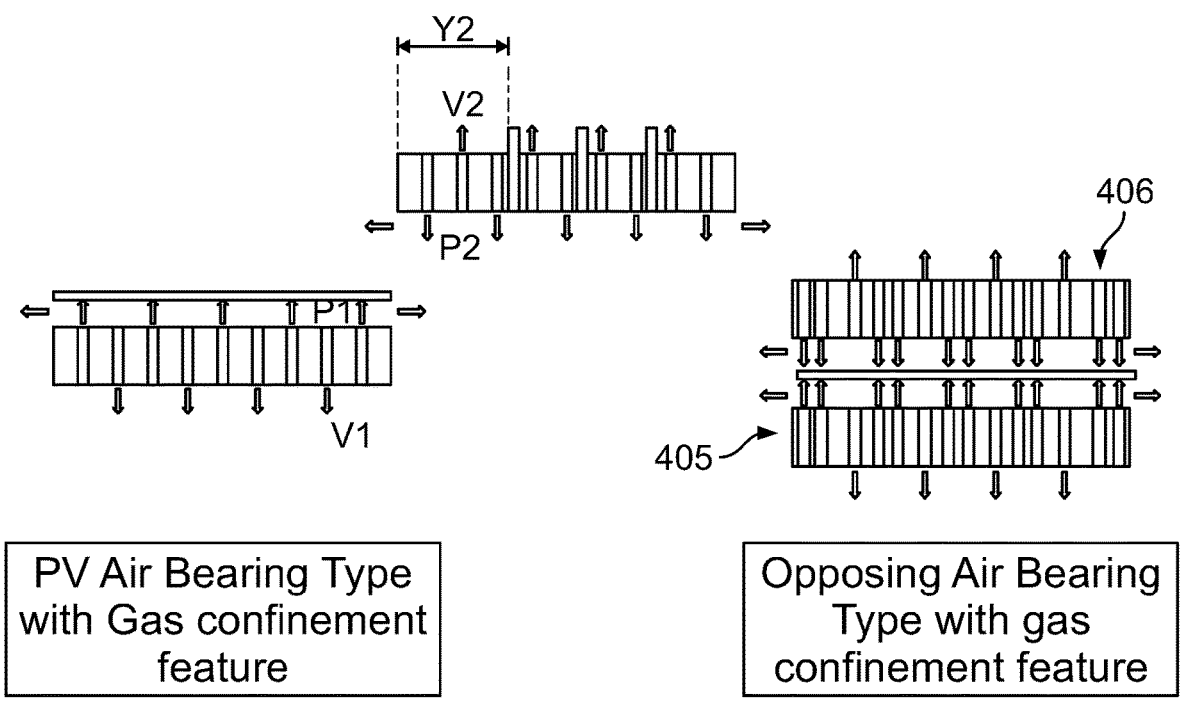
FIG. 4E shows an example OVJP system in which print bars are immersed in a PV table according to embodiments disclosed herein.

In some embodiments, the print bars also may be immersed in a PV table, such as 406 as shown in FIG. 4E, which may be concurrently or separately controlled relative to the substrate PV table 405. The print bar PV table may operate as a bearing as shown in FIG. 4E, which further serves to flatten the substrate similarly to operation of the substrate PV table and/or grippers as disclosed herein. In some embodiments, movement of the substrate PV table and the print bar assembly (whether immersed in a PV table or not) is coordinated to achieve a specific relative physical arrangement as previously disclosed. The position of the print bars and/or the individual print engines on each print bar may be adjustable relative to the physical frame holding the print bars and/or relative to a substrate being processed by the system. For example, the height of the print bars above the substrate may be adjustable. Where multiple print bars are used, their heights may be adjustable concurrently or independently such that the height of each can be adjusted without affecting the height of the others. The print bars 412 and/or the PV table 405 also may be rotatable within a plane parallel to the substrate, for example to allow for printing in "portrait" or "landscape" mode without rotating the substrate.

An in-situ print head alignment, metrology, and inspection subsystem 409 may be used as previously disclosed, which is shown in a "parked" configuration in FIG. 4A. During operation, the subsystem 409 may be moved along the main y-direction 401 similarly to the substrate PV table 405.

As previously disclosed, one or more aligners, such as visual cameras, IR cameras, barcode readers, or similar sensors 415 may be used to align a substrate arranged on the PV table 405 with the print bars 412. For example, the PV table 405 or the substrate itself may include various physical or electronic markers that can be positioned at a known arrangement relative to the print bars 412 or the print bar support table 406. The aligner sensor(s) 415 may be disposed on a common physical frame with the print bars 412, for example to make sure that any movement of the print bars 412 is accounted for by the aligners 415. Alternatively, the sensors 415 may be separate from the printing subsystem and may be located outside the deposition chamber. For example, some types of aligner sensors may not be compatible with the high-vacuum environment in the deposition chamber. Regardless of positioning, the sensors 415 may provide signals that allow for the relative position of the substrate and the print bars to be adjusted to maintain proper alignment as previously disclosed. As another example, aligner sensors may be vacuum-compatible but may be located outside of the deposition chamber for other reasons, such as ease of user access, installation preference, or the like.

FIG. 4D shows a front view of the OVJP system in FIGS. 4A-4C positioned in a vacuum chamber. The vacuum chamber 450 may be constructed such that each portion is sealed to the others to preserve the low-pressure internal environment. For example, the lid 451 may be sealed to the body via O-rings 452 or similar mechanisms. OVJP system support columns 470 may pass through the vacuum chamber 450, with the associated openings in the vacuum chamber base being sealed by pass-through sealed bellows 472. External isolators 477 keep the OVJP system 499 physically isolated from vibrations and other movement of the ambient environment and/or the vacuum chamber itself. More generally, these features allow the deposition system 499, which may be the system shown in FIGS. 4A-4C or any other embodiment disclosed herein, to be isolated from the vacuum chamber 450 base and walls so that movement of the chamber will not affect processing of devices by the deposition system.

In some embodiments, opposing bearings may be used to flatten out the thickness variations of the substrate, for example as shown in FIG. 4E. As compared to other embodiments disclosed herein, the substrate does not undergo large motions or large accelerations, because the gross motions may be performed by the moving substrate PV table 405. The grippers 420 that are arranged parallel to the movement direction of the substrate PV table 405 may be used to make minor adjustments to correct for repeatable motion errors of the moving PV table 405.

As with other embodiments disclosed herein, the substrate may be rotated, for example using the substrate grippers, 90 degrees to and from "portrait" and "landscape" modes or any other desired orientation, depending on the alignment of the longer side of the substrate relative to the print bars. Alternatively, the entire table may be rotated between orientations. This may be preferred in some arrangements because incomplete coverage of the PV table may affect the floating properties of the substrate.

In some embodiments, the substrate PV table 405 also may be used to cool the substrate, for example via passive and/or active cooling techniques. As previously disclosed, such rotation may be made independently of any other motion or positioning of the PV float table. For example, the grippers used to position the substrate on the PV table may rotate the substrate to any desired position regardless of the position of the table, and/or while the table is in motion along the primary y-axis of the system.

Figure 6:
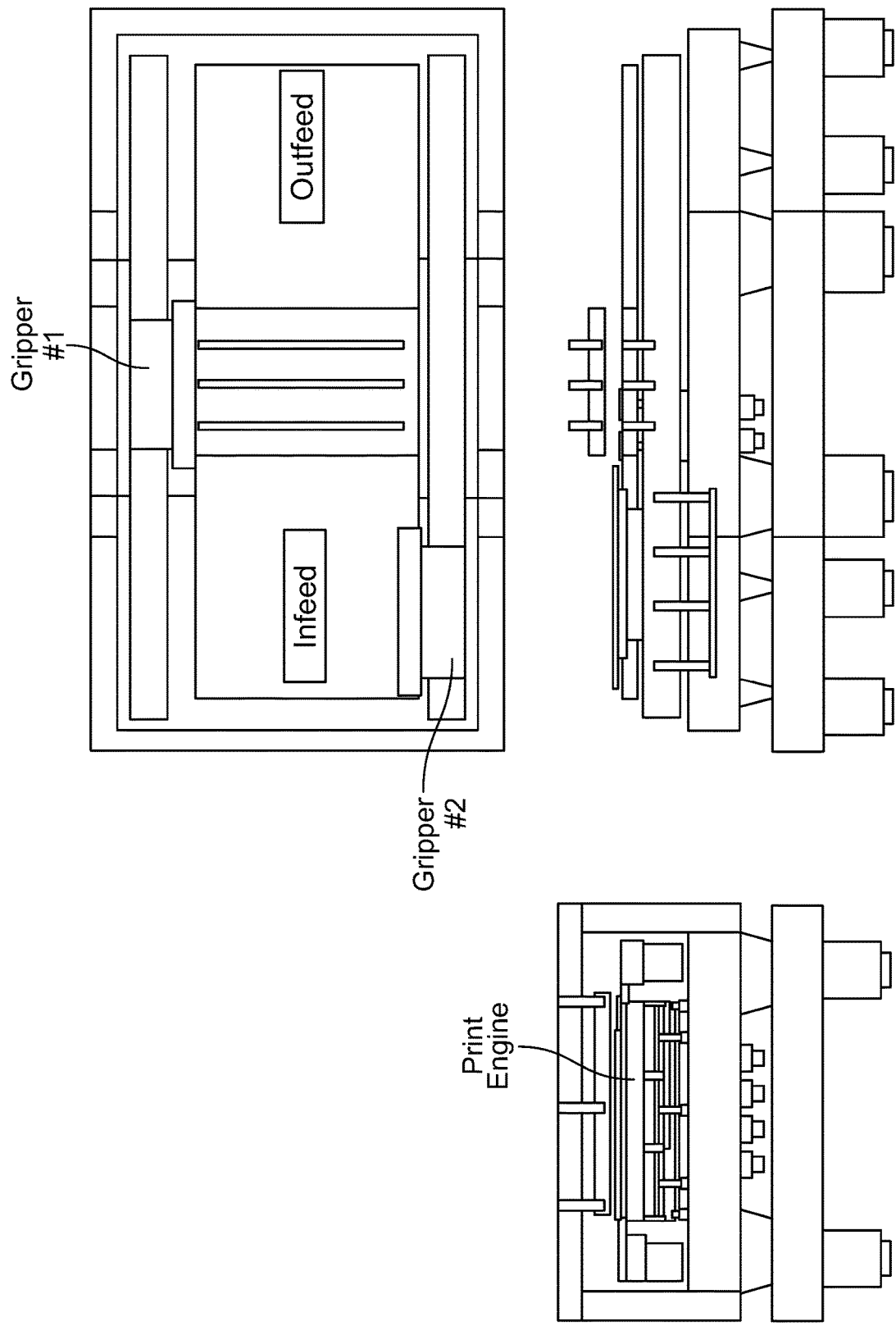
FIG. 6 shows an example deposition system in which a substrate enters with the active side facing down, and in which the substrate moves on a stationary PV table that extends through the system according to embodiments disclosed herein.

The embodiment shown in FIGS. 4A-4E and other embodiments disclosed herein also may allow for reduced consumption of float table gas, since there is no infeed or outfeed air table. For example, in contrast to other embodiments disclosed herein, the substrate may cover the float table at all times during the printing process, thereby minimizing consumption of the float table gas (such as Nitrogen) during operation. In other embodiments that use infeed and/or outfeed float table system architectures, the substrate typically moves on top of and along the infeed and outfeed table(s). The table thus is partially covered by the glass in transit and accordingly may require much higher gas consumption. An example of such an arrangement is shown in FIG. 6, which uses a long stationary float table with infeed/outfeed areas, rather than a float table on a moving stage. The embodiments in FIGS. 4A-4E also have relatively dew moving parts above the substrate, which further reduces the chances of particle contamination during the printing process.

Figure 5A:
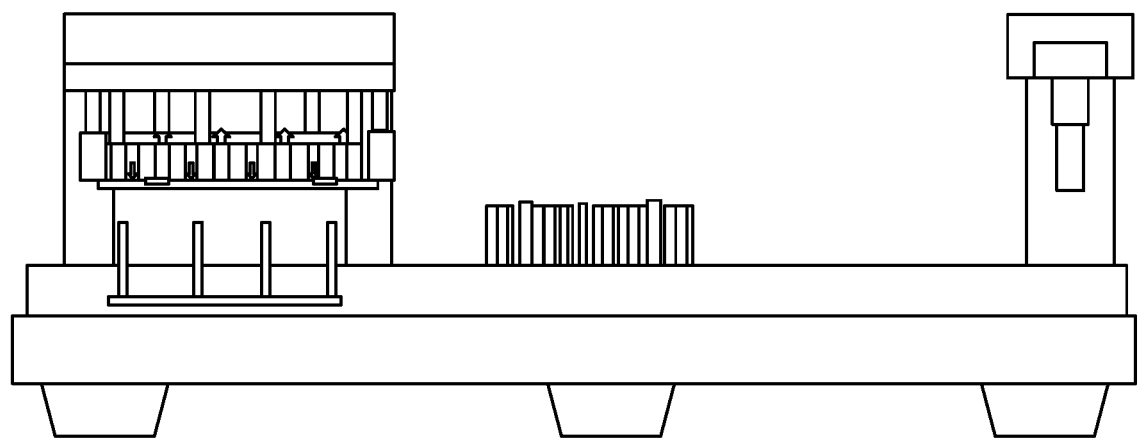
FIGS. 5A and 5B show side and front views, respectively, of an arrangement in which the substrate and print bars are flipped vertically compared to those shown in FIGS. 4A-4E according to embodiments disclosed herein.
Figure 5B:
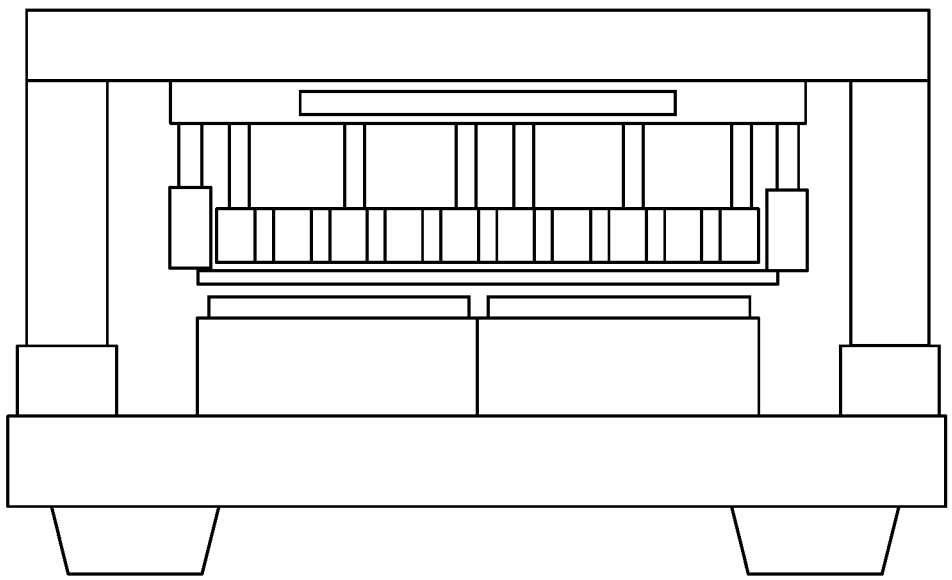

FIGS. 5A and 5B show side and front views, respectively, of a similar arrangement in which the substrate and print bars are flipped vertically compared to the embodiment of FIGS. 4A-4E. That is, the system uses the same PV chuck concept as described with respect to FIGS. 4A-4E for holding the substrate while moving. However, the substrate enters the system with the active side facing down and the print bars are disposed underneath the substrate relative to the direction of gravity, though for clarity of process description the substrate still typically is described as being disposed "below" the print bars because material is still ejected from the OVJP print head(s) toward the substrate, opposite the direction of gravity. The gantry is above the substrate. The risk of unintentional downward motion of the substrate toward the print bars may be managed using the PV chuck that secures the substrate. A similar PV system may be used in other embodiments disclosed herein, such as the embodiment shown in FIG. 8 or, more generally, any embodiment in which it is desired for the substrate to be positioned above the OVJP print bars relative to the direction of gravity.

FIGS. 6-9 show alternate embodiments that include some or all of the features previously described with respect to FIGS. 4-5.

FIG. 6 shows top, front, and side views of an embodiment in which the substrate 110 enters the system from a load lock with the active side (i.e., the side on which organic layers and other OLED layers are to be deposited and which will emit light after fabrication) facing down, as with the arrangement in FIGS. 5A-5B. In this embodiment, the substrate moves on a PV table that extends through the system, in contrast to the smaller PV table in FIGS. 4 and 5 which is moved through the system with the substrate. The area of the PV table in which material is printed on the substrate provides precise control of the separation between the print bars and the substrate as previously disclosed. Similar to the arrangements in FIGS. 4-5, the substrate is supported on lift pin air pads for alignment so that it does not physically contact any other surface, thereby reducing or eliminating tribological ESD voltage buildup. In this arrangement the lift pin may contact the back (non-active) side of the substrate. In contrast, in the arrangement in FIG. 5, the lift pins would contact the active side of the substrate during loading or unloading, which is undesirable. Using lift pins with air pads allows the substrate to float on an air cushion provided by the air pads during loading, unloading, or alignment of the substrate in the system. The substrate may be held and moved by one or more grippers as previously disclosed, which contact the substrate on the non-active back side. The substrate moves on a PV air table from the infeed zone, through the area under the print bars and onto an air table in the outfeed zone, with the active side always being referenced to the air table. Automatic or semi-automatic alignment as previously disclosed, such as via the use of cameras or other aligners, may be used to more precisely position the substrate.

The print bars lie under the plane of the substrate, print upward towards the active side of the substrate and span the direction perpendicular to the primary motion of the substrate. The print bars may be immersed in a dedicated PV air table in such a fashion that the active side of the substrate is directly referenced to the PV air table of the print bar. This allows for precise control of the vertical fly height gap between the substrate and the print bars below, independent of variations in the thickness of the substrate. The comparatively light weight of the substrate and moving gripper allow for accurate dynamic control of the motion of the substrate during the print process. A similar print bar PV table arrangement may be used in any other embodiment disclosed herein, to allow for further control of the vertical distance between the substrate and print bars.

Figure 7:
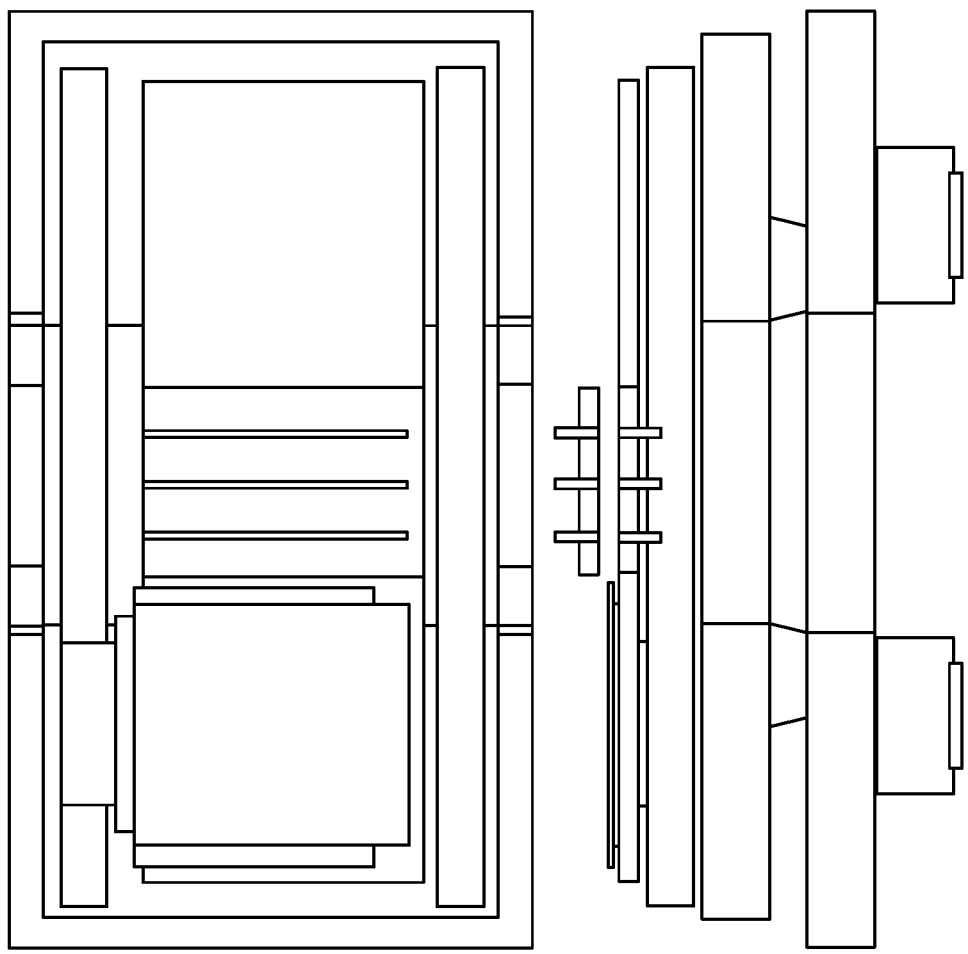
FIG. 7 shows an example system similar to that of FIG. 6, in which the substrate is positioned with the active side facing up according to embodiments disclosed herein.
Figure 7:
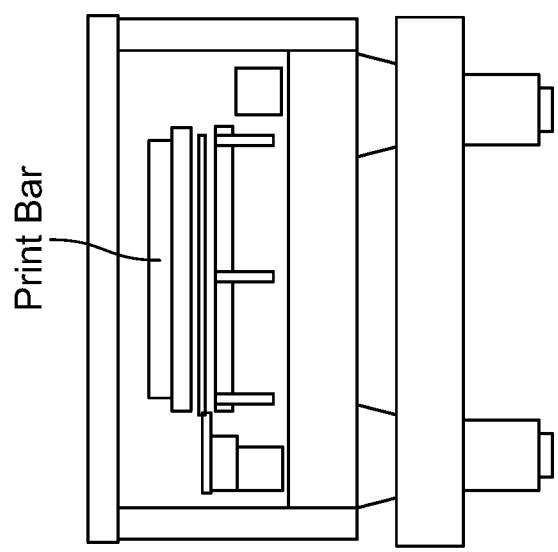

FIG. 7 shows an arrangement similar to that of FIG. 6, but in which the substrate enters the system from the load lock with the active side facing up. Other than the relative positioning of the substrate and print bars, the arrangement of FIG. 7 is the same or essentially the same as in FIG. 6. The substrate is supported on lift pin air pads for alignment so that the substrate does not physically contact any other surface, and may be held moved by one or more grippers, which contact the substrate on the non-active back side. The substrate moves on an air table from the infeed zone, through the area under the print bars and onto an air table in the outfeed zone. The print bars lie above the plane of the substrate, print downward towards the active side of the substrate and span the direction perpendicular to the primary motion of the substrate. The print bars also may be immersed in a dedicated PV air table as previously disclosed, which may be configured to provide precise control of the vertical fly height gap between the substrate and the print bars above. The comparatively light weight of the substrate and moving gripper allow for accurate dynamic control of the motion of the substrate during the print process.

Figure 8:
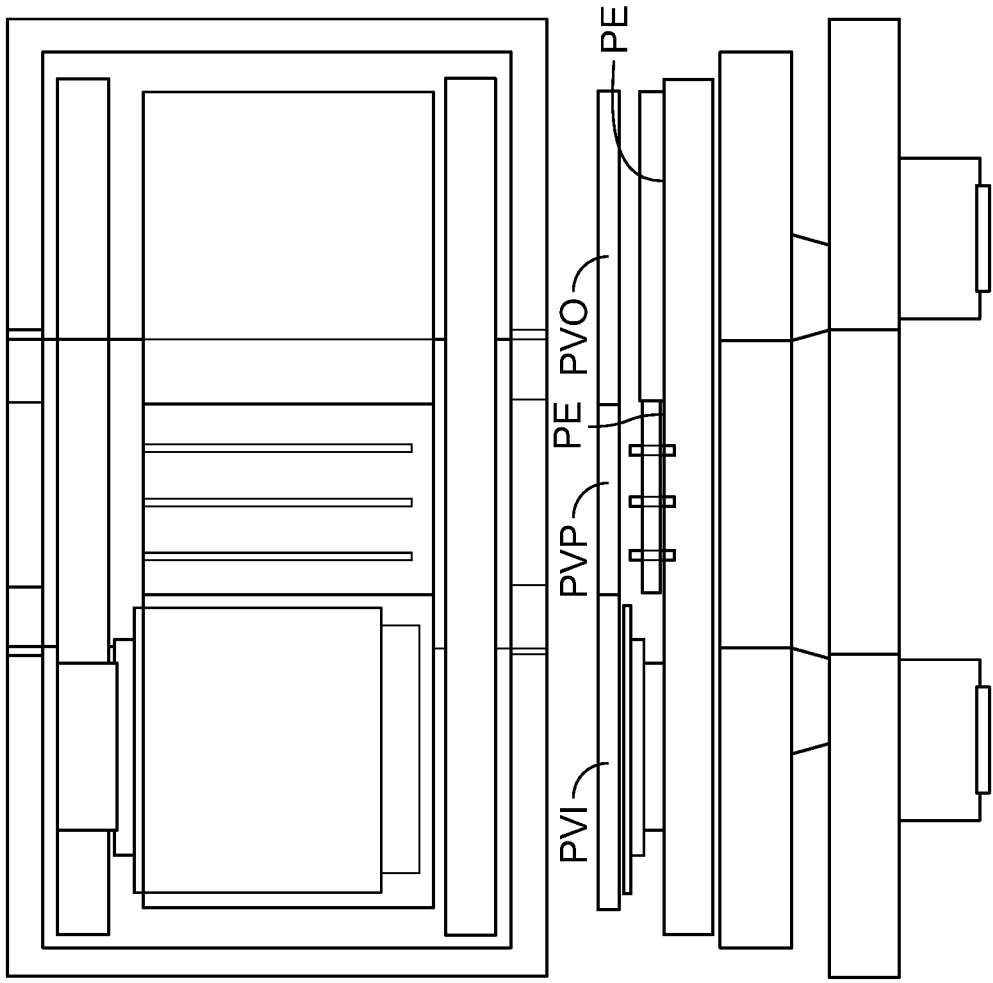
FIG. 8 shows an example deposition system in which a substrate is arranged with the active side facing down similar to the example of FIG. 6, in which the non-active back side of the substrate is held by a top PV table according to embodiments disclosed herein.
Figure 8:
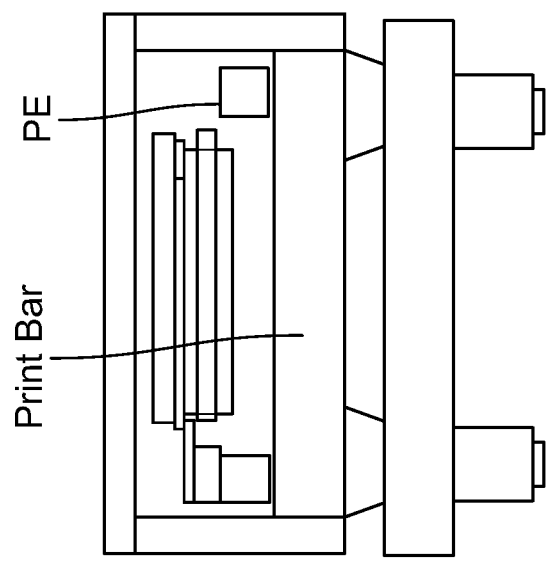

FIG. 8 shows an arrangement in which the substrate enters the system with the active side facing down, as in FIG. 6. In this arrangement, the non-active back side of the substrate is held by the top PV table, as opposed to the active front side of the substrate being supported by the lower PV table as shown in FIG. 6. The substrate may be supported on lift pin air pads for alignment as previously disclosed to reduce or eliminate tribological ESD voltage buildup. Air tables in the infeed and outfeed regions reference the non-active back side of the substrate. The print bars are disposed underneath the substrate relative to the direction of gravity in the print zone and the substrate is held from the top as it moves past the print bars. As a result, such an embodiment may benefit from more stringent motion and PV control to prevent gravity from causing portions of the substrate to sag or for the entire substrate to move. The print bars print upward towards the active side of the substrate and span the direction perpendicular to the primary motion of the substrate. As with the arrangement shown in FIG. 6, the print bars themselves may be in a dedicated PV air table to allow for more precise control of the vertical fly height gap between the substrate and the print bars below, independent of variations in the thickness of the substrate. The comparatively light weight of the substrate and moving gripper allow for accurate dynamic control of the motion of the substrate during the print process.

Figure 9:
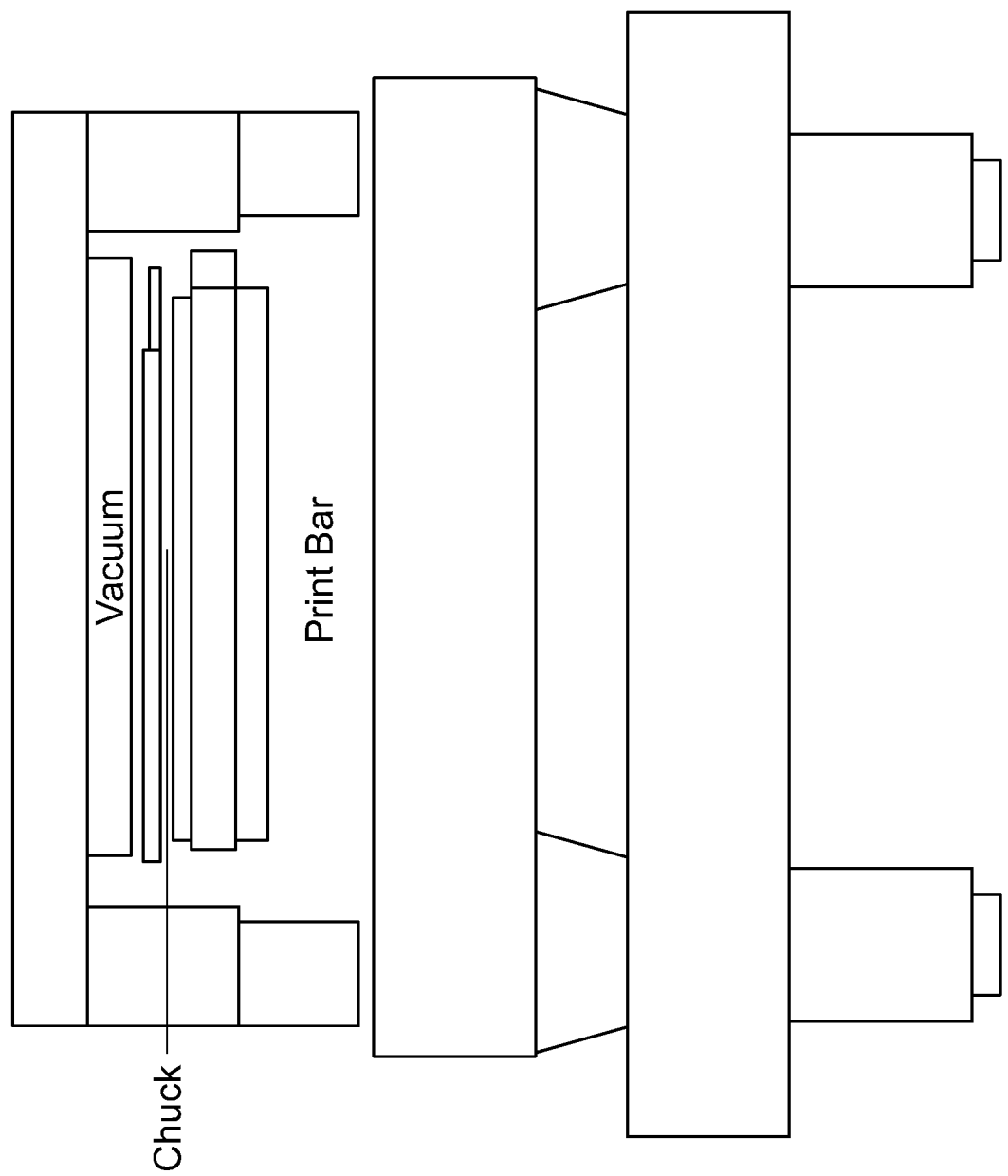
FIG. 9 shows a front view of an example deposition system in which the substrate is not supported on an air table upon entry into the system as in FIGS. 6 and 7, but instead is held from above by a vacuum chuck or similar device with the active side facing down according to embodiments disclosed herein.

FIG. 9 shows a front view of an alternative arrangement in which, in contrast to the arrangements shown in FIGS. 6 and 7, the substrate is not supported on an air table upon entry into the system. Instead, the substrate is vacuum chucked onto a large and very flat chuck surface with the active side facing down. The print bars are disposed underneath the substrate relative to the force of gravity and print upward onto the active surface of the substrate. The moving substrate payload is necessarily much heavier than in FIGS. 6 and 7 and this heavy mass is moved through the system. As a result, correction of dynamic motion errors in this arrangement may require careful consideration.

Embodiments disclosed herein allow for substrates to exit the system after material has been deposited via the OVJP print bars in one of two ways: either via the input load lock through which the substrate initially entered the deposition system, or; through a dedicated output load lock, to allow for "in-line" onward forward dispensation of substrates such as in a dedicated fab environment. Inline arrangements may use dedicated features of the vacuum chambers and the system transport envisaged to enable the inline motion. For example, referring to the arrangement shown in FIG. 6 and similar arrangements, a dual gripper option may be used in which a first dedicated gripper transports the substrate past the print bars and onto an exit air table, and a second separate gripper now transports the substrate to the exit load lock while the primary gripper returns rapidly to the input air table to accept a new substrate from the input load lock. Similar mechanisms may be used for any other system transport arrangements disclosed herein, including any of those described with respect to FIGS. 4-9.

Embodiments disclosed herein may be operable at a range of internal pressures. Although the deposition chamber may be referred to as a "vacuum chamber," operating pressures within the chamber during deposition by the OVJP deposition system may be as high as 100-300 Torr or in some embodiments up to 400 Torr, which is sufficient to allow substrates to be floated on a float table as disclosed herein but at much higher pressure than conventional "vacuum" operating pressures.

Unless explicitly indicated otherwise or impossible or impractical due to physical constrains, any feature disclosed herein with respect to one or more embodiments may be used with any other embodiments disclosed and/or claimed herein. As non-limiting examples, any embodiments that use substrate grippers as disclosed herein may include edge and/or back-side substrate grippers in any configuration and arrangement disclosed or shown with respect to any of the embodiments disclosed herein. As another non-limiting example, any embodiment disclosed herein may allow for rotation of a substrate in the x-y plane during processing of the substrate in the deposition system.

In addition to the arrangements presented herein in which a substrate is moved through a region below print bars, in some embodiments a substrate may be held stationary relative to the deposition chamber while the print bar structure is moved above it. More generally, although described herein as movement of the substrate, equivalent movement may be accomplished by moving the substrate and/or the print bar structure(s) relative to one another. For example, a float table and one or more grippers as previously disclosed may be used to hold a substrate stationary in a deposition system while still minimizing physical contact with the substrate. One or more print engines, print bars, print heads, or any suitable combination thereof may then be moved across the region above the substrate while material is ejected from the print head(s) to be deposited on the substrate.

Although disclosed and shown with respect to jet printing of organic materials for ease of illustration, embodiments disclosed herein may be used to deposit other materials and/or variant deposition techniques. For example, non-organic materials, biological materials, or other materials that are compatible or essentially compatible with the general process parameters that are known to be suitable to organic materials or known modifications thereof may be used.

As a specific example, any embodiments disclosed herein may be used to deposit lines of condensable material on a glass or similar substrate, such as architectural glass. Such lines may be used to absorb IR radiation, provide electrical leads for embedded electronic components, or create other properties of the glass as a whole. Such lines may be relatively thin, for example 25, 50, or 100 µm, meaning that they can be printed on the glass without significantly impacting the apparent transparency of the glass. As a specific example, where thin lines of IR-absorbent material are printed on the glass, the resulting glass may be suitable for use in office buildings and similar locations where it is desirable to allow for a good deal of visual light to enter the building while also blocking a good deal of infrared. Embodiments disclosed herein may be particularly suited for such applications in contrast to conventional deposition systems, especially jet-based systems, which may not be well-suited to manipulate and deposit on relatively large substrates as disclosed herein.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic vapor jet printing (OVJP) deposition system comprising:
   a plurality of OVJP print bars, each comprising a plurality of OVJP print heads;
   a float table comprising:
      one or more substrate grippers configured to hold a substrate having a first active surface, and to adjust a position of the substrate on the float table in at least two degrees of motion; and
      one or more controls arranged to provide control over the one or more substrate grippers; and
   one or more sensors configured to measure an alignment of a substrate on the float table with the plurality of OVJP print bars;
   wherein a height of each of the plurality of OVJP print bars is configured to be adjusted independently of each of the other OVJP print bars of the plurality of OVJP print bars;
   wherein the float table is configured to be moved in a region that extends below the plurality of OVJP print bars; and
   wherein the substrate is configured to be moved on the float table independently of movement of the float table below the plurality of OVJP print bars.

2. The OVJP deposition system of claim 1, wherein the one or more controls comprise pressure-vacuum (PV) controls.

3. The OVJP deposition system of claim 1, wherein each of the plurality of OVJP print bars comprises at least one print engine which comprises the plurality of OVJP print heads of the print bar, the print engine being configured to control the height of the associated OVJP print bar above the float table.

4. The OVJP deposition system of claim 1, wherein the float table comprises a pressure-vacuum (PV) float table.

5. The OVJP deposition system of claim 1, wherein the one or more substrate grippers are configured to control a vertical position of the substrate relative to the float table.

6. The OVJP deposition system of claim 5, wherein the one or more substrate grippers are configured to maintain the substrate in a planar arrangement.

7. The OVJP deposition system of claim 6, wherein the one or more substrate grippers are configured to counteract a sag of the substrate due to the force of gravity and/or inherent warpage of the substrate in an edge region of the substrate.

8. The OVJP deposition system of claim 1, wherein the one or more substrate grippers are configured to be controlled by the float table so that movement of the substrate grippers is determined at least in part by movement of the float table.

9. The OVJP deposition system of claim 1, wherein the one or more substrate grippers are configured to rotate the substrate independent of any other motion of the float table.

10. The OVJP deposition system of claim 1, wherein the one or more sensors are disposed outside a deposition chamber containing the plurality of OVJP print bars and the float table.

11. The OVJP deposition system of claim 1, wherein:
   a height of each of the plurality of the OVJP print heads on each OVJP print bar of the plurality of OVJP print bars is configured to be adjusted independently of the height of the each OVJP print bar.

12. The OVJP deposition system of claim 11, wherein the height of each of the plurality of OVJP print heads is configured to be adjusted independently of each of the other OVJP print heads.

13. The OVJP deposition system of claim 1, wherein the plurality of OVJP print bars comprise at least three OVJP print bars.

14. The OVJP deposition system of claim 1, wherein at least two OVJP print bars of the plurality of OVJP print bars are arranged and configured to print on a same area of the substrate as the substrate passes below the two OVJP print bars.

15. The OVJP deposition system of claim 1, wherein the OVJP deposition system is configured so that the substrate does not contact any physical surface other than the one or more substrate grippers while being processed by the OVJP deposition system.

16. The OVJP deposition system of claim 1, wherein the float table is configured to provide cooling to the substrate.

17. The OVJP deposition system of claim 1, wherein one or both of the float table and the plurality of OVJP print bars are configured to be rotated relative to the other.

18. An organic vapor jet printing (OVJP) deposition system comprising:
   a plurality of OVJP print bars, each comprising one or more OVJP print heads;
   a float table comprising:
      one or more substrate grippers configured to hold a substrate having a first active surface, and to adjust a position of the substrate on the float table in at least two degrees of motion; and
      one or more controls arranged to provide control over the one or more substrate grippers; and
   one or more sensors configured to measure an alignment of a substrate on the float table with the plurality of OVJP print bars;
   wherein a height of each of the plurality of OVJP print bars is configured to be adjusted independently of each of the other OVJP print bars of the plurality of OVJP print bars;
   wherein the float table is configured to be moved in a region that extends below the plurality of OVJP print bars; and
   wherein the substrate is configured to be moved on the float table independently of movement of the float table below the plurality of OVJP print bars; and
   wherein a height of the one or more OVJP print heads on each OVJP print bar of the plurality of OVJP print bars is configured to be adjusted independently of the height of the each OVJP print bar.

19. The OVJP deposition system of claim 18, wherein the one or more controls comprise pressure-vacuum (PV) controls.

20. The OVJP deposition system of claim 18, wherein each of the plurality of OVJP print bars comprises at least one print engine which comprises the one or more OVJP print heads of the print bar, the print engine being configured to control the height of the associated OVJP print bar above the float table.

21. The OVJP deposition system of claim 18, wherein the float table comprises a pressure-vacuum (PV) float table.

22. The OVJP deposition system of claim 18, wherein the one or more substrate grippers are configured to control a vertical position of the substrate relative to the float table.

23. The OVJP deposition system of claim 22, wherein the one or more substrate grippers are configured to maintain the substrate in a planar arrangement.

24. The OVJP deposition system of claim 23, wherein the one or more substrate grippers are configured to counteract a sag of the substrate due to the force of gravity and/or inherent warpage of the substrate in an edge region of the substrate.

25. The OVJP deposition system of claim 18, wherein the one or more substrate grippers are configured to be controlled by the float table so that movement of the substrate grippers is determined at least in part by movement of the float table.

26. The OVJP deposition system of claim 18, wherein the one or more substrate grippers are configured to rotate the substrate independent of any other motion of the float table.

27. The OVJP deposition system of claim 18, wherein the one or more sensors are disposed outside a deposition chamber containing the one or more OVJP print bars and the float table.

28. The OVJP deposition system of claim 18, wherein the height of each of the plurality of OVJP print heads is configured to be adjusted independently of each of the other OVJP print heads.

29. The OVJP deposition system of claim 18, wherein the plurality of OVJP print bars comprise at least three OVJP print bars.

30. The OVJP deposition system of claim 18, wherein at least two OVJP print bars of the plurality of OVJP print bars are arranged and configured to print on a same area of the substrate as the substrate passes below the two OVJP print bars.

31. The OVJP deposition system of claim 18, wherein the OVJP deposition system is configured so that the substrate does not contact any physical surface other than the one or more substrate grippers while being processed by the OVJP deposition system.

32. The OVJP deposition system of claim 18, wherein the float table is configured to provide cooling to the substrate.

33. The OVJP deposition system of claim 18, wherein one or both of the float table and the plurality of OVJP print bars are configured to be rotated relative to the other.

* * * * *